United States Patent
Vitunic

(10) Patent No.: US 9,846,196 B2
(45) Date of Patent: Dec. 19, 2017

(54) INPUT CURRENT CONDITIONER FOR PRECISION COULOMB COUNTING

(71) Applicant: Linear Technology Corporation, Milpitas, CA (US)

(72) Inventor: Mark Robert Vitunic, Lexington, MA (US)

(73) Assignee: Linear Technology Holding LLC., Milpitas, CA (US)

( * ) Notice: Subject to any disclaimer, the term of this patent is extended or adjusted under 35 U.S.C. 154(b) by 327 days.

(21) Appl. No.: 14/805,757

(22) Filed: Jul. 22, 2015

(65) Prior Publication Data

US 2016/0259009 A1 Sep. 8, 2016

Related U.S. Application Data

(60) Provisional application No. 62/126,833, filed on Mar. 2, 2015.

(51) Int. Cl.
*G01N 27/416* (2006.01)
*G01R 31/36* (2006.01)

(52) U.S. Cl.
CPC .................. *G01R 31/3617* (2013.01)

(58) Field of Classification Search
USPC ........................................................ 324/426
See application file for complete search history.

(56) References Cited

U.S. PATENT DOCUMENTS

| | | | | |
|---|---|---|---|---|
| 2007/0252575 A1* | 11/2007 | Miaille | .............. | G01R 31/3613 324/76.11 |
| 2010/0102787 A1* | 4/2010 | Zelig | .................. | H02M 3/1582 323/282 |
| 2014/0191741 A1 | 7/2014 | Nork | | |
| 2015/0058654 A1* | 2/2015 | Ukai | .................. | G01R 31/3693 702/63 |

OTHER PUBLICATIONS

Linear Technology Corporation, Nanopower Buck-Boost DC/DC with Integrated Coulomb Counter, Copyright 2015, 28 pages.

* cited by examiner

*Primary Examiner* — Robert Grant
(74) *Attorney, Agent, or Firm* — Intelletek Law Group, PLLC

(57) ABSTRACT

A method and system of counting coulombs drawn from a power source by a load. A reference current source regulates the current drawn by the load at any given time to be either zero or a predetermined fixed amount. A comparator controls a time the switch is closed and open. When the switch is closed, coulombs are allowed to be drawn from the power source, and prevented to be drawn when the switch is open. An oscillator generates a clock signal during the time the switch is closed. A counter counts the number of clock cycles from the clock signal during the time the switch is closed. The count is provided as a signal at a second output of the coulomb counter.

18 Claims, 4 Drawing Sheets

INPUT CURRENT CONDITIONER FOR PRECISION COULOMB COUNTING

CROSS REFERENCES TO RELATED APPLICATIONS

The present application claims the benefit of priority under 35 U.S.C. §119 from U.S. Provisional Patent Application Ser. No. 62/126,833, entitled "Input Current Conditioner for Precision Coulomb Counting," filed on Mar. 2, 2015, which is hereby incorporated by reference in its entirety for all purposes.

BACKGROUND

Technical Field

This disclosure generally relates to a power supply system, and more particularly, to tracking coulombs drawn from a power source.

Description of Related Art

In many applications, it is beneficial to know how much charge has been consumed since a battery was installed or fully charged. This information may be used, for example, for estimating the remaining battery life. Coulomb counters, sometimes referred to as "gas gauges," are often used in battery-powered circuits to monitor the usage of the battery, which is measured in coulombs (i.e., 1 coulomb=1 ampere*1 second). Graphically, if battery current is plotted on the y-axis vs. time on the x-axis, coulomb usage is represented by the area under the curve.

Battery capacity may be rated in units of amp·hour, where 1 amp·hour=3600 amp·sec=3600 coulombs. For example, a battery with a capacity of 1 A·hour, would nominally be expected to deliver 1 A for one hour, 2 A for 0.5 hour, or 0.1 A for 10 hours, etc., before being depleted.

Real world loads, however, may not be well-defined. For example, a battery connected to the input of a DC-DC converter may be subject to a load whose input current waveform has AC and DC components. Further, there may be a large dynamic range between the highest and lowest (but nonzero) instantaneous values.

In this regard, FIG. 1 illustrates an example of input current that is provided by a power source (e.g., battery) to a buck DC-DC converter. FIG. 1 demonstrates how uneven and erratic the input current drawn by a load can be. The current profile may include current spikes 102 due to inductor currents, sequences of which are sometimes referred to as bursts. There may be other components, such as gate charge current spikes 104. During the active period, there is a DC quiescent current 106. During the sleep period, there is a second quiescent current 108 that may be lower than the active quiescent current.

Accordingly, there is a bursting phase where power is delivered to the load, which is followed by a sleep phase, where power is not delivered to the load but lost nonetheless due to the quiescent sleep current 108. The burst rate is determined by the load and the output capacitor ($C_{OUT}$, illustrated in FIGS. 2A and 2B).

Circuits to count the coulombs at the input of the DC-DC converter presently exist, but they can be large and complicated. Moreover, prior art coulomb counters can be subject to large errors when counting coulombs at low power levels. The greatest source of this error can be the large (but finite) dynamic range of the instantaneous currents.

FIG. 2A illustrates a known approach where a coulomb counter uses a current sense resistor $R_{SENSE}$ 204 in series with the input $V_{IN}$ to create a small voltage drop across the resistor 204 that is proportional to the input current $I_{BUCK}$. The profile of the current is illustrated by way of example in waveform 202 (which is a replica of the waveform of FIG. 1 discussed above. The voltage drop across the sense resistor 204 serves as an input to the coulomb counter 206, which may include an integrator to calculate and report the area under the current vs. time curve 202. For example, the LTC2941/2/3 and LTC4150 integrated circuits from Linear Technology Corporation use this technique.

Because the voltage drop across the sense resistor 204 represents an efficiency loss, the peak voltage drop across the sense resistor 204 is generally kept small (e.g. 50 mV). Further, the ratio of the highest current to the lowest current may be 100,000 (or even higher), which also prevents using a "large" sense resistor 204 because of the substantial voltage drop across the resistor 204 it would require. The limitation of using a small sense resistor 204 can create an accuracy challenge at small instantaneous currents across the sense resistor because the integrator may have a finite offset that may exceed the IR drop created by the smallest instantaneous input current. Put differently, when the current through the sense resistor 204 is low, this low current cannot be accurately detected due to the low resistance of the sense resistor 204.

Further, at light loads, the DC-DC converter may spend the majority of the time in a sleep state, which results in the highest error of calculating the coulombs drawn from the power source. In addition, due to the AC nature of the input current waveform, bandwidth issues can further affect accuracy. For example, the integrator has a finite bandwidth (i.e., the highest frequency of an input signal at which it can perform the integration with acceptable accuracy). If the input current contains frequency components higher than this bandwidth (e.g., possibly the gate charge current spikes), these additional components typically result in additional error.

The burst rate is determined by the load at $V_{OUT}$ and the output capacitor $C_{OUT}$. Both the sleep time and the burst time are proportional to $C_{OUT}$. For example, the sleep and burst times can be calculated by equations 1 and 2 below.

$$\text{Sleep Time} = \frac{C_{OUT} \times V_{RIPPLE}}{I_{LOAD}} \qquad \text{EQ. 1}$$

$$\text{Burst Time} = \frac{C_{OUT} \times V_{RIPPLE}}{ISW_{BUCK} - I_{LOAD}} \qquad \text{EQ. 2}$$

Where:

$C_{OUT}$ is the output capacitor 220 (e.g., a constant);

$ISW_{BUCK}$ is the current the buck converter can deliver when in burst mode (e.g., constant for a predetermined set of conditions);

$V_{RIPPLE}$ is the ripple in the output voltage (e.g., depends on the implementation, but typically small); and $I_{LOAD}$ is the load current (e.g., application dependent).

FIG. 2B illustrates an alternate known implementation of counting coulombs. The approach of FIG. 2B forgoes the use of the current sense resistor 204 of FIG. 1. Instead, FIG. 2B includes a coulomb counter 256 that counts only the coulombs associated with inductor current IL when the switch 258 is closed. The implementation of FIG. 2B exploits the known shape of the current profile IL 260 flowing in the inductor L based on the particular DC-DC topology in order to simplify the architecture.

Thus, instead of determining the area of the uneven and erratic profile of the current 202 of FIG. 1, the circuit of FIG.

2B essentially takes the area of triangles provided by the current profile 260. The LTC3335 integrated circuit from Linear Technology Corporation uses this technique. Advantageously, there is no efficiency loss associated with having a separate current sense resistor as in FIG. 2A. However, some of the current components (such as gate charge current spikes 104 and DC quiescent currents 106 and 108 of FIG. 1) may not be accounted for, resulting in lower (but generally predictable) accuracy at all power levels.

A commonality in both prior art implementations is that the raw input current waveform to the coulomb counter may not be "well-behaved" under the various conditions that the circuit may operate and therefore difficult to accurately calculate the coulombs drawn from a power source by a load.

Accordingly, prior art approaches may exhibit efficiency loss and may lead to large coulomb counter errors, particularly at light loads. It is with respect to these considerations and others that the present disclosure has been written.

BRIEF DESCRIPTION OF DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION OF ILLUSTRATIVE EMBODIMENTS

In the following detailed description, numerous specific details are set forth by way of examples in order to provide a thorough understanding of the relevant teachings. However, it should be apparent that the present teachings may be practiced without such details. In other instances, well-known methods, procedures, components, and/or circuitry have been described at a relatively high-level, without detail, in order to avoid unnecessarily obscuring aspects of the present teachings. Some embodiments may be practiced with additional components or steps and/or without all of the components or steps that are described.

The methods and circuits disclosed herein generally relate to tracking coulombs drawn from a power source, such as a battery. The coulomb counter counts the coulombs drawn from a power source by a load, such as a DC-DC converter. The coulomb counter includes a reference current source that is configured to regulate a current drawn by the load from the power source. There is a switch coupled between the reference current source and the output of the coulomb counter. The reference current source is configured to provide either a zero or fixed current amount to the load. The opening and closing of the switch is facilitated by a comparator that is configured to compare the voltage at the input of the coulomb counter and its output.

By opening and closing the switch, the input current provided to the load is "conditioned" to be a well-defined square wave with only two instantaneous values: a precision trimmed reference current ($I_{REF}$) and zero. There is essentially no error associated with the coulomb counter when the input current provided by the reference current is zero, regardless of the duration of the zero. That is because, unlike the prior art implementations that have quiescent current during sleep mode, no coulombs are being drawn from the power source during this period.

Figure 1:
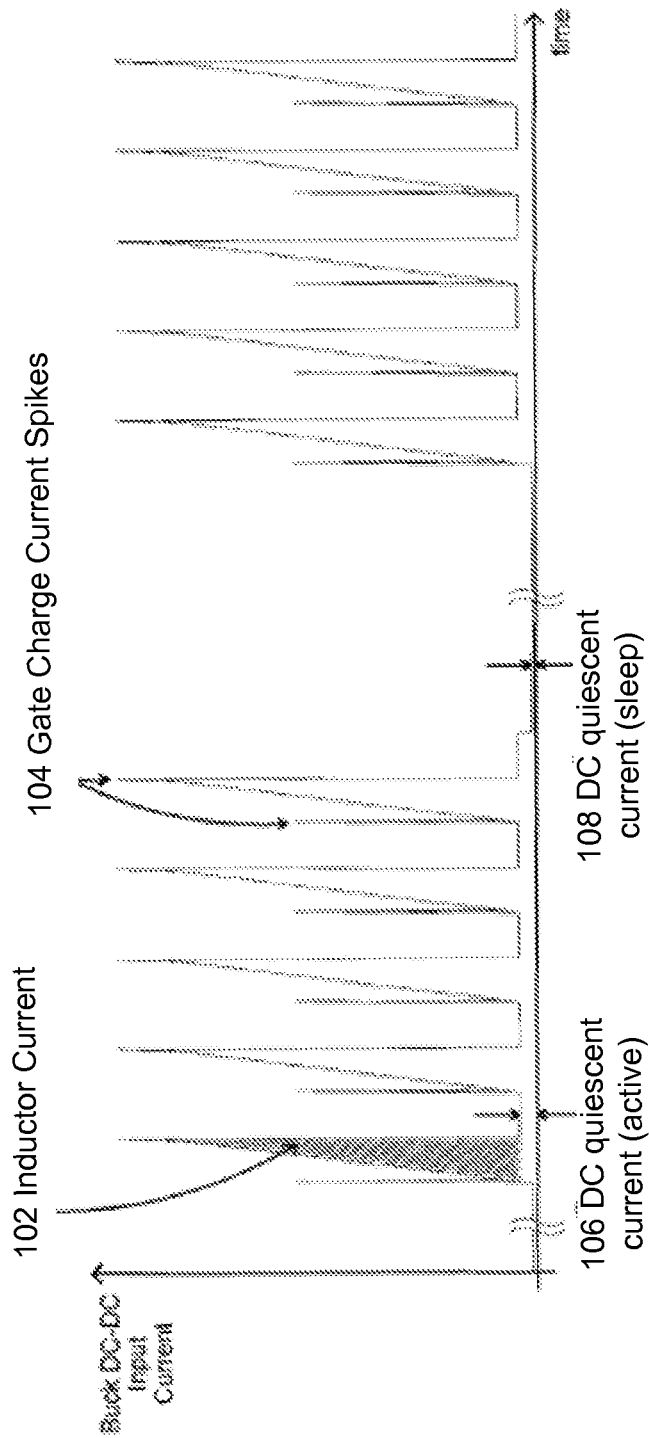
FIG. 1 illustrates an example of input current to a buck DC-DC converter.
Figure 2A:
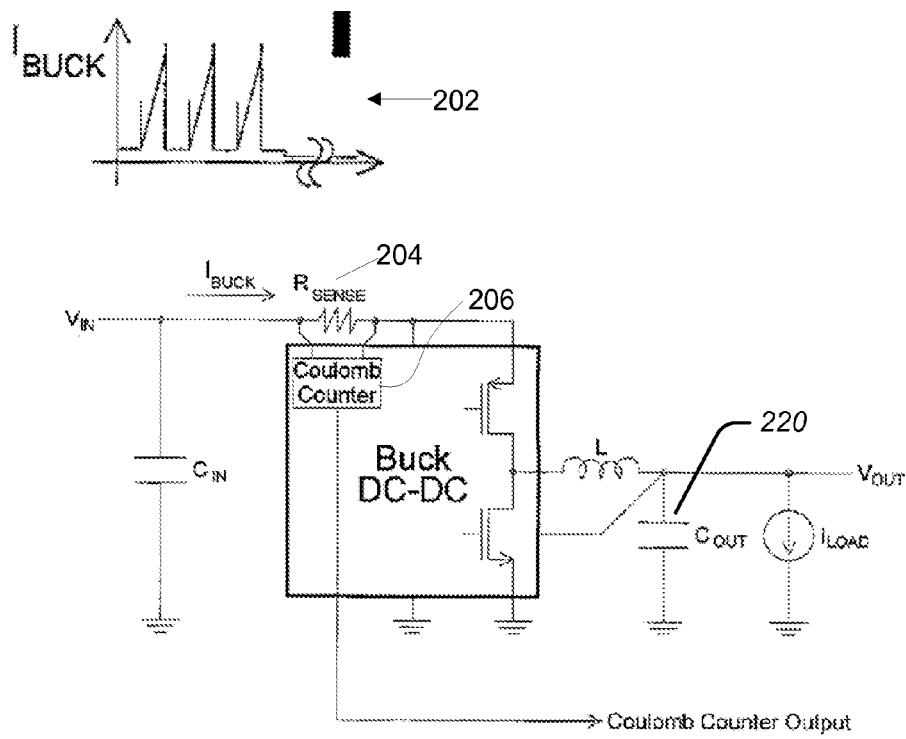
FIGS. 2A and 2B illustrate prior art coulomb counters used in connection with a DC-DC converter.
Figure 2B:
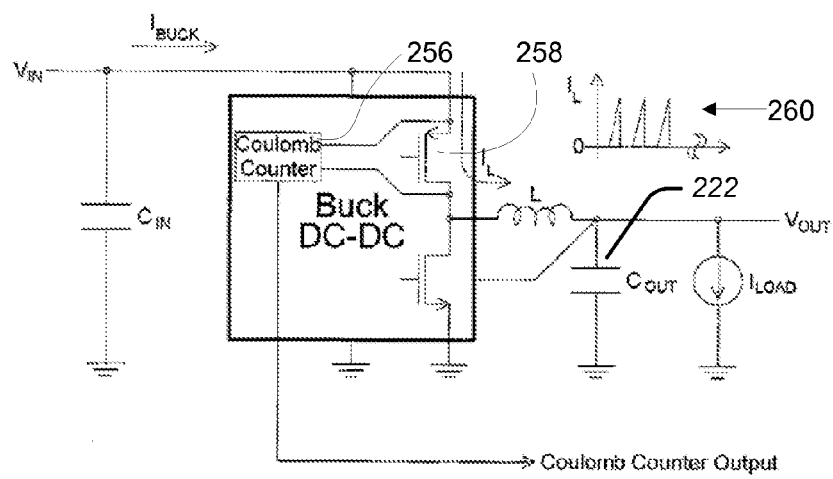
Figure 4:
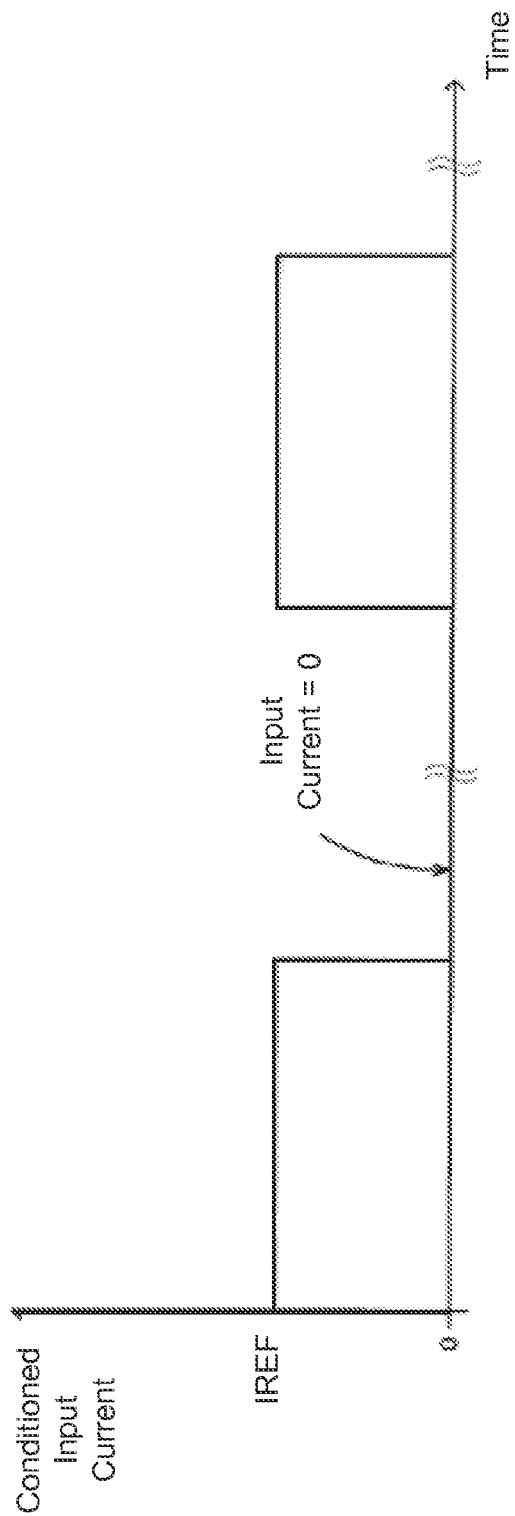
FIG. 4 illustrates an example of a conditioned input current that may flow in the coulomb counter illustrated in FIG. 3.

An example of a "conditioned" input current waveform that may flow in the coulomb counter discussed herein is shown in FIG. 4. The duration for which the conditioned input current is ON or OFF is determined by the value of the precision trimmed reference current and the value of a capacitor coupled to the output of the coulomb counter. The average value of the current provided by the conditioned current profile of FIG. 4 is similar to the average current provided by the current profile of FIG. 1. Thus, even though both FIGS. 1 and 4 provide the same number of coulombs, the conditioned current profile of FIG. 4 facilitates making a more accurate estimate of the coulombs drawn from the power source.

Advantageously, the coulombs drawn from the power source during the time that the input current is at the $I_{REF}$ level, is simplified to a calculation of $I_{REF}*t$. Measuring and reporting the coulomb count is as simple as turning a precision trimmed oscillator ON every time the switch is closed, and OFF every time the switch is open, and then counting how many cumulative cycles the oscillator was ON. Significantly, the accuracy of the coulomb counter is no longer based on the DC-DC input current profile of the prior art. Instead, in one aspect, the accuracy may be based on the precision of the control of the DC $I_{REF}$ and the precision of the time the switch is closed, which are more simple and accurate to implement.

Figure 3:
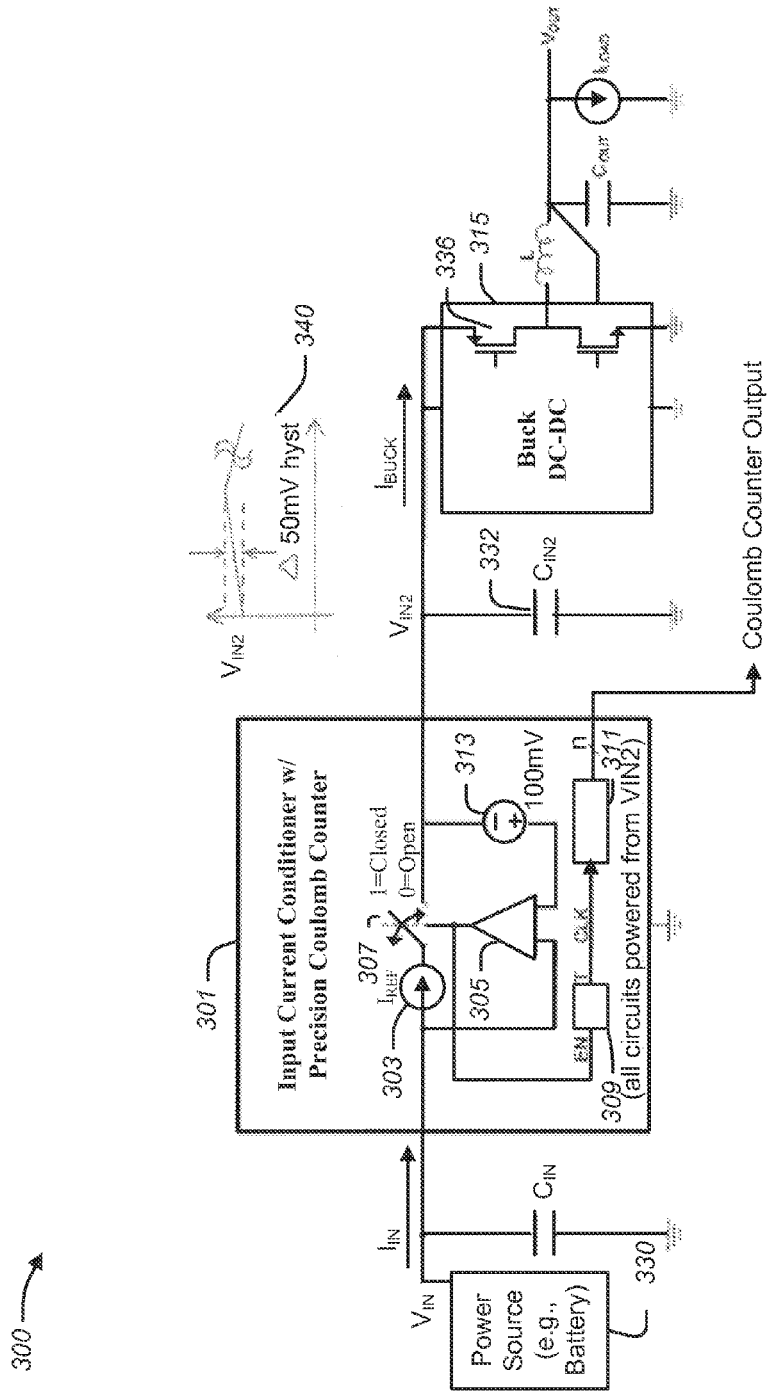
FIG. 3 illustrates an example of a coulomb counter that uses an input current conditioner and is connected to a buck DC-DC converter.

With the foregoing overview, reference now is made in detail to the examples illustrated in the accompanying drawings. FIG. 3 illustrates a coulomb counter 301, consistent with an exemplary embodiment. By way of example, circuit 300 is coupled to a DC-DC buck converter, although it will be understood that other topologies, such as boost, buck-boost, flyback, etc., are supported as well. Indeed, the circuit and techniques discussed herein are compatible with any load, while they are most advantageous with input current waveforms that have an uneven or erratic profile.

The coulomb counter circuit 301 is configured for counting coulombs drawn from the power source 330 (e.g., battery) by a load 315, configured in the example of FIG. 3 as a buck DC-DC converter. The coulomb counter 301 includes a reference current source ($I_{REF}$) 303 coupled between an input node $V_{IN}$ and an output node $V_{IN2}$ and configured to regulate a current drawn by the load 315 from the power source 330.

The coulomb counter circuit 301 includes a switch 307 coupled between the reference current source 303 and the output node $V_{IN2}$ of the coulomb counter 301. In various embodiments, the switch 307 may be implemented using one or more field effect transistors (e.g., NFET, PFET, an NFET in combination with a PFET, etc.) or their comparable bipolar devices. When the switch is closed, current from the current source $I_{REF}$ 303 is allowed to pass to the output node $V_{IN2}$. When the switch 307 is open, current is not allowed to pass to the output node $V_{IN2}$.

There is a comparator 305 having a first input node (positive terminal) coupled to the input node ($V_{IN}$) of the coulomb counter 301, a second input node (negative terminal) coupled to the output node $V_{IN2}$ of the coulomb counter 301, and an output node EN coupled to a control node of the switch 307. In one embodiment, there is a voltage source 313 coupled between the second input node of the comparator 305 and the output node of the coulomb counter $V_{IN2}$ and configured to provide a predetermined offset (e.g., 100 mV) for the comparator 305. The comparator 305 is configured to control an open and closed time for the switch 307. In one embodiment, the comparator includes hysteresis. The hysteresis effect is discussed in more detail later.

In one embodiment, there is an output capacitor $C_{IN2}$ (332) coupled to the output node ($V_{IN2}$) of the coulomb counter 301. The output capacitor 332 is operative to support the load 315 when the switch 307 is open by providing the load 315 a voltage source. The duration for which the conditioned input current is ON or OFF is determined by the value of the current of the reference current source ($I_{REF}$) 303 and the value of the output capacitor $C_{IN2}$ (332). Both the ON time and the OFF time are proportional to $C_{IN2}$. The relationship may be better understood in view of equations 3 and 4 below.

$$IREF_{ON} \text{ Time} = \frac{C_{IN2} \times V_{HYST}}{I_{REF} - I_{BUCK}} \quad \text{EQ. 3}$$

$$IREF_{OFF} \text{ Time} = \frac{C_{IN2} \times V_{HYST}}{I_{BUCK}} \quad \text{EQ. 4}$$

Where, $C_{IN2}$ is the output capacitor 332 (e.g., a constant);
$I_{REF}$ is the reference current 303 (e.g., constant);
$V_{HYST}$ is the comparator 305 voltage hysteresis (e.g., a constant); and
$I_{BUCK}$ is the input current to the load during $IREF_{ON}$ and $IREF_{OFF}$ (e.g., not a constant).

There is an oscillator 309 coupled to the output node of the comparator 305. The oscillator is enabled when the switch 307 is closed (i.e., the comparator 305 provided an output signal to activate the switch 307). The oscillator continues to provide a clock signal at its output (i.e., CLK) as long as the switch is closed. The output of the oscillator is coupled to a counter 311 that receives the clock signal at the output of the oscillator 309 and counts the number of cycles during the time the switch 307 is closed. The count is provided at a second output of the coulomb counter 301.

Thus, the example coulomb counter 301 of FIG. 3, conditions the input current $I_{IN}$ before it provides it to the load (illustrated by way of example as a buck DC-DC converter 315). More specifically, the current source 303 may deliver a constant current $I_{REF}$ (which can be turned ON and OFF with the switch 307). In one embodiment, the current source 303 is a low-dropout current source, thereby allowing the output voltage $V_{IN2}$ to be similar to the input voltage $V_{IN}$.

In the example of FIG. 3, the current source 303 is placed between a power source 330 (providing $V_{IN}$) and an input to the DC-DC converter 315, represented by the source of PFET 336 of the load 315, thereby providing the intermediate output node $V_{IN2}$. Additionally, the output voltage ($V_{IN2}$) of the coulomb counter 301 may have a low voltage, low frequency ripple that may be observed at the input to the load 315, as illustrated in curve 340. This generally does not cause downstream regulation problems, but it may provide some duty-cycle modulation in the DC-DC converter switch waveform, which can be readily controlled.

In one embodiment, if $V_{IN2}$ is more than a first predetermined threshold (e.g., 150 mV) below $V_{IN}$ (such as at start up), the switch 307 may turn ON the current source 303 and charge may be delivered from $V_{IN}$ to $V_{IN2}$ at the constant rate of $I_{REF}$. This determination is performed by the comparator 305. When $V_{IN2}$ charges up to within a second predetermined threshold voltage (e.g. 100 mV) of $V_{IN}$, the switch 307 turns OFF the current source $I_{REF}$ 303, and the load 315 can be supported by a $C_{IN2}$ capacitor 332 while the current provided by the power source (e.g., battery) goes to zero.

In one embodiment, a voltage source 313 may be used to provide a desired voltage offset. For example, the offset may be set at 100 mV, while it will be understood that any suitable offset may be used. Similarly, the first and second predetermined thresholds (e.g., 100 mV and 150 mV) that have been used in FIG. 3 are example implementations. Accordingly, other suitable first and second predetermined thresholds may be used as well. In one embodiment, the first and second predetermined thresholds are as small as possible, while still allowing $I_{REF}$ to be accurate. For example, the accuracy of the current source 303 (and by extension the accuracy of the coulomb counter 301) generally degrades (or becomes impractical to implement because of the complexity of the additional circuitry required) as the differential voltage across the current source 303 becomes smaller.

As noted above, the (e.g., hysteresis) comparator 305 controls the open and closed state of the switch 307 and is configured to sense both the first predetermined threshold and the second predetermined threshold. The output node of the comparator 305 is operative to provide the signal that closes and opens the switch 307 to turn current source $I_{REF}$ 303 ON and OFF, thereby controlling the time that the power source 330 provides current. On average the current provided by the power source 330 is substantially equal to the current provided by the current source 303 ($I_{REF}$). The same output node of the comparator 305 that is used to drive the switch 307 may also be used to turn ON and OFF the oscillator 309. In one embodiment, the oscillator 309 is configured to provide a clock signal (CLK) with a precision period T. This output of the oscillator 309 is used to increment the counter 311. Accordingly, the counter 311 provides bits at its output node that represent a count n of the coulombs that were drawn from the power source 330 (e.g., battery).

Advantageously, the accuracy of the coulomb counter is based now on the precision of the current source 303 providing $I_{REF}$ and the precision of the period during which the switch is closed (T), which are each substantially controllable and can be configured for a desired precision. For example, in one embodiment, these components only require a trimmed accurate current source and a trimmed accurate time base, both of which are readily available. Accordingly, accuracy is always provided, even at low power levels where prior art techniques typically falter. It is believed that those skilled in the art are adequately familiar with the structure and optimization of current sources and oscillators—such structures are therefore not included for brevity.

In one embodiment, the count of the counter 311 may be reset after the power source 330 (e.g., battery) is recharged or replaced.

In various embodiments, one or more circuits of the coulomb counter 301 may be powered by the voltage at the output node $V_{IN2}$. In one example, all circuits of the coulomb counter 301 are powered by the voltage at the output node $V_{IN2}$, thereby ensuring zero power source 330 (e.g., battery) current when the switch 307 has turned off the current source 303. In this embodiment, any power consumed by the coulomb counter 301 while the switch 307 is open is provided by the output capacitor $C_{IN2}$ 332. To refresh capacitor $C_{IN2}$ 332 (i.e. bring it back up in voltage), the current source 303 $I_{REF}$ is turned back ON and any coulombs consumed are counted. Accordingly, the coulomb counter 301 not only counts the coulombs drawn from the battery to power the buck, but also those required to power the coulomb counter 301 itself through bootstrapping. Thus, any charge consumed by the coulomb counter 301 does not manifest itself as a parasitic loss that is not accurately calculated. Rather, the charge consumed by the coulomb counter 301 is attributed as an output "load," thereby facilitating its accurate calculation by the coulomb counter 301 itself.

The components, steps, features, objects, benefits, and advantages that have been discussed herein are merely illustrative. None of them, nor the discussions relating to them, are intended to limit the scope of protection in any way. Numerous other embodiments are also contemplated. These include embodiments that have fewer, additional, and/or different components, steps, features, objects, benefits, and/or advantages. These also include embodiments in which the components and/or steps are arranged and/or ordered differently.

For example, any signal discussed herein may be scaled, buffered, scaled and buffered, converted to another mode (e.g., voltage, current, charge, time, etc.,), or converted to another state (e.g., from HIGH to LOW and LOW to HIGH) without materially changing the underlying control method. Although a buck DC-DC converter is used in the examples herein, it will be understood that other topologies, such as boost, buck-boost, flyback, etc., are supported as well. Indeed, the circuit and techniques discussed herein are compatible with any load.

In one example, the MOS transistors in FIG. 3 could be replaced by bipolar transistors. In other embodiments, the circuits could be reconfigured to use PNP transistors instead of NPN transistors (and PMOS transistors instead of NMOS) while still adhering to the principles of the subject matter disclosed herein. Accordingly, it is intended that the invention be limited only in terms of the appended claims.

It should be noted that the coulomb counter circuit may place an element in series with the power source 330 (e.g., such as a low-dropout current source 303). While this may create an efficiency loss for all loads, the coulombs drawn from the power source 330 are accurately accounted for as discussed above. If the average current source dropout voltage is configured to be 100 mV, this may represent a 2% efficiency loss for a 5V input, or a 3.3% efficiency loss for a 3.3V input. Accordingly, the higher the input voltage from the power source 330, the lower the percent efficiency loss due to the coulomb counter 301.

Unless otherwise stated, all measurements, values, ratings, positions, magnitudes, sizes, and other specifications that are set forth in this specification, are approximate, not exact. They are intended to have a reasonable range that is consistent with the functions to which they relate and with what is customary in the art to which they pertain.

Except as stated immediately above, nothing that has been stated or illustrated is intended or should be interpreted to cause a dedication of any component, step, feature, object, benefit, advantage, or equivalent to the public, regardless of whether it is or is not recited in the claims.

All articles, patents, patent applications, and other publications that have been cited in this disclosure are incorporated herein by reference.

It will be understood that the terms and expressions used herein have the ordinary meaning as is accorded to such terms and expressions with respect to their corresponding respective areas of inquiry and study except where specific meanings have otherwise been set forth herein. Relational terms such as "first" and "second" and the like may be used solely to distinguish one entity or action from another, without necessarily requiring or implying any actual relationship or order between them. The terms "comprises," "comprising," and any other variation thereof when used in connection with a list of elements in the specification or claims are intended to indicate that the list is not exclusive and that other elements may be included. Similarly, an element preceded by an "a" or an "an" does not, without further constraints, preclude the existence of additional elements of the identical type.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A coulomb counter for counting coulombs drawn from a power source by a load, the coulomb counter comprising:
   a reference current source ($I_{REF}$) coupled between an input node and an output node of the coulomb counter and configured to regulate a current drawn by the load from the power source;
   a switch coupled between the reference current source and the output node of the coulomb counter;
   a comparator having a first input node coupled to the input node of the coulomb counter, a second input node coupled to the output node of the coulomb counter, and an output node coupled to a control node of the switch, wherein the comparator is configured to control a time the switch is closed and a time the switch is open;
   an output capacitor coupled to the output node of the coulomb counter;
   an oscillator coupled to the output node of the comparator; and
   a counter having an input coupled to an output node of the oscillator and configured to count a number of oscillator cycles during the time the switch is closed and provide the count at a second output node.

2. The coulomb counter of claim 1, wherein the reference current source is configured to regulate the current drawn by the load at any given time to either be zero or a predetermined fixed amount.

3. The coulomb counter of claim 1, wherein one or more circuits of the coulomb counter are each powered by a voltage at the output node of the coulomb counter.

4. The coulomb counter of claim 1, further comprising a voltage source coupled between the second input node of the comparator and the output node of the coulomb counter, wherein the voltage source is configured to provide a predetermined offset for the comparator.

5. The coulomb counter of claim 1, wherein the comparator includes hysteresis.

6. The coulomb counter of claim 1, wherein the comparator is configured, upon determining that a voltage at the output node of the coulomb counter is below a voltage at the input node of the coulomb counter by over a first predetermined threshold, to close the switch and allow a charge to be drawn by the load from the power source at a constant rate controlled by the current source.

7. The coulomb counter of claim 6, wherein the comparator is configured, upon determining that the voltage at the output node of the coulomb counter is within a second predetermined threshold of the voltage at the input node of the coulomb counter, to open the switch and prevent a charge to be drawn by the load from the power source.

8. The coulomb counter of claim 7, wherein the second predetermined threshold has a magnitude that is less than a magnitude of the first predetermined threshold.

9. The coulomb counter of claim 1, wherein no coulomb counting errors are associated with the coulomb counter when the reference current is zero.

10. The coulomb counter of claim 1, wherein the number of coulombs drawn by the power source is based on a product of the regulated current of the current source and the time the switch is closed.

11. The coulomb counter of claim 1, wherein an accuracy of a number of counted coulombs by the coulomb counter is based mainly on an accuracy of the current of the current source and an accuracy of the determination of the time the switch is closed.

12. A method of counting coulombs drawn from a power source by a load, in a coulomb counter having a reference current source ($I_{REF}$), a switch coupled between the reference current source and a first output node of the coulomb counter; a comparator coupled between an input node and the first output node of the coulomb counter, an oscillator coupled to an output node of the comparator, a counter coupled to an output of the oscillator, and a second output of the coulomb counter, the method comprising:

regulating, by the reference current source, the current drawn by the load at any given time to either be zero or a predetermined fixed amount;

controlling, by the comparator, a time the switch is closed and a time the switch is open;

allowing, by the switch, coulombs to be drawn from the power source when the switch is closed and preventing coulombs from being drawn from the power source when the switch is open;

generating, by the oscillator, a clock signal only during the time the switch is closed;

counting a number of clock cycles from the clock signal during the time the switch is closed; and providing a signal at the second output of the coulomb counter that indicates the number of counted clock cycles.

13. The method of claim 12, further comprising powering the coulomb counter by a voltage at the first output node of the coulomb counter.

14. The method of claim 12, further comprising, upon determining by the comparator that a voltage at the output node of the coulomb counter is below a voltage at the input node of the coulomb counter by over a first predetermined threshold, closing the switch and allowing a charge to be drawn by the load from the power source at a constant rate controlled by the current source.

15. The method of claim 14, further comprising, upon determining by the comparator that the voltage at the output node of the coulomb counter is within a second predetermined threshold of the voltage at the input node of the coulomb counter, opening the switch and preventing a charge to be drawn by the load from the power source.

16. The method of claim 14, wherein the second predetermined threshold has a magnitude that is less than the first predetermined threshold.

17. The method of claim 12, further comprising determining a number of coulombs drawn by the power source based on a product of the regulated current of the current source and the time the switch is closed.

18. The method of claim 12, wherein an accuracy of a number of counted coulombs by the coulomb counter is based on an accuracy of the current of the current source and an accuracy of the determination of the time the switch is closed.

* * * * *